(12) United States Patent
Martin

(10) Patent No.: US 11,839,017 B2
(45) Date of Patent: Dec. 5, 2023

(54) THERMAL PRESS-FIT TERMINAL

(71) Applicant: TE Connectivity Services GmbH, Schaffhausen (CH)

(72) Inventor: Galen M. Martin, Middletown, PA (US)

(73) Assignee: TE Connectivity Solutions GmbH

( * ) Notice: Subject to any disclaimer, the term of this patent is extended or adjusted under 35 U.S.C. 154(b) by 142 days.

(21) Appl. No.: 17/394,893

(22) Filed: Aug. 5, 2021

(65) Prior Publication Data
US 2023/0044199 A1 Feb. 9, 2023

(51) Int. Cl.
*H05K 1/02* (2006.01)
*H05K 7/20* (2006.01)

(52) U.S. Cl.
CPC .......... *H05K 1/0204* (2013.01); *H05K 7/205* (2013.01)

(58) Field of Classification Search
CPC ........ H05K 7/20; H05K 1/145; H05K 1/0203; H05K 1/0204; H05K 1/0205; H05K 1/0209; H05K 1/11; H05K 1/18; H05K 3/222; H05K 3/308; H05K 3/325; H05K 3/42; H05K 9/0028; H05K 2201/1059; G06F 1/20; H01R 12/58; H01R 12/585; H01R 12/7064; H01R 13/05; H01R 13/6595; H01R 13/03; H01R 4/58; H01L 23/433; H01L 23/4338; F28F 9/26; F16B 21/12; B23P 15/26

See application file for complete search history.

(56) References Cited

U.S. PATENT DOCUMENTS

| 4,274,699 | A | * | 6/1981 | Keim | H01R 12/58 439/82 |
| 2001/0031567 | A1 | * | 10/2001 | Orui | H05K 3/368 439/74 |
| 2004/0242033 | A1 | * | 12/2004 | Hu | H01R 12/585 439/82 |
| 2005/0083661 | A1 | * | 4/2005 | Lee | H01L 23/4093 257/E23.099 |
| 2008/0050947 | A1 | * | 2/2008 | Nunokawa | H01R 12/585 439/82 |
| 2009/0168381 | A1 | * | 7/2009 | Suehiro | H05K 3/368 29/854 |
| 2009/0241538 | A1 | * | 10/2009 | Yoshinaga | H05K 1/0204 29/829 |
| 2009/0325406 | A1 | * | 12/2009 | Kojima | H01R 12/585 439/82 |

(Continued)

FOREIGN PATENT DOCUMENTS

KR  20190031471 A  *  3/2019

OTHER PUBLICATIONS

KR20190031471 English Translation (Year: 2019).*

Primary Examiner — Amir A Jalali

(57) ABSTRACT

A press-fit terminal for connecting a first component and a second component includes a first elastic portion for engaging with the first component, a second elastic portion for engaging with the second component, and an intermediate portion arranged between the first and second elastic portions in an axial direction of the terminal. The intermediate portion comprises a first plurality of radially extending arms for engaging with the first component and a second plurality of radially extending arms for engaging with the second component.

16 Claims, 4 Drawing Sheets

(56) References Cited

U.S. PATENT DOCUMENTS

| | | | |
|---|---|---|---|
| 2010/0093197 A1* | 4/2010 | Sander | H05K 3/308 |
| | | | 439/82 |
| 2012/0320545 A1* | 12/2012 | Lo Presti | H05K 7/1432 |
| | | | 361/752 |
| 2013/0165001 A1* | 6/2013 | Kataoka | H01R 12/585 |
| | | | 439/889 |
| 2014/0017914 A1* | 1/2014 | Endo | H01R 12/73 |
| | | | 439/81 |
| 2021/0265899 A1* | 8/2021 | Yamada | H05K 7/1427 |

* cited by examiner

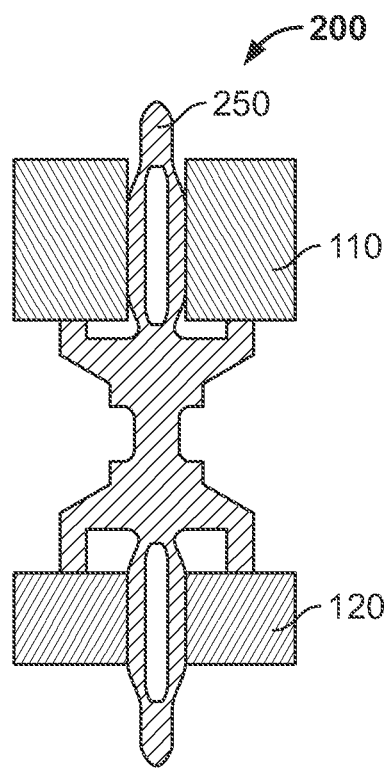
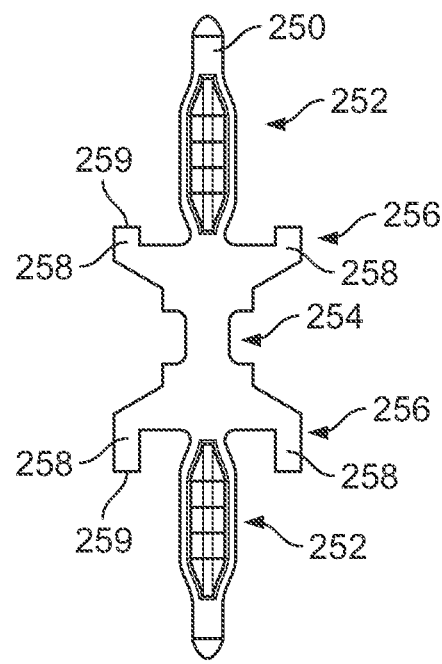
Fig. 4    Fig. 5
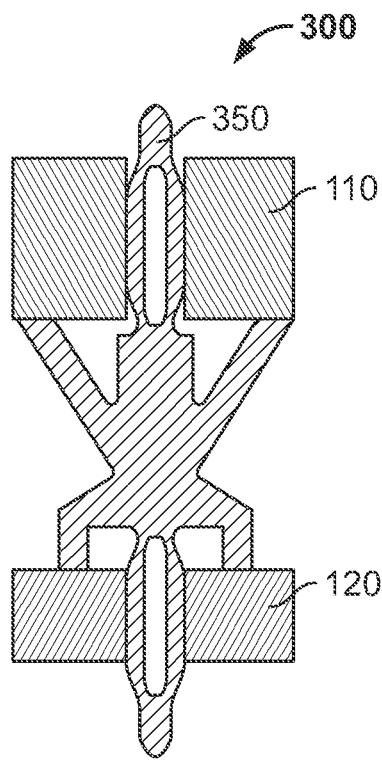
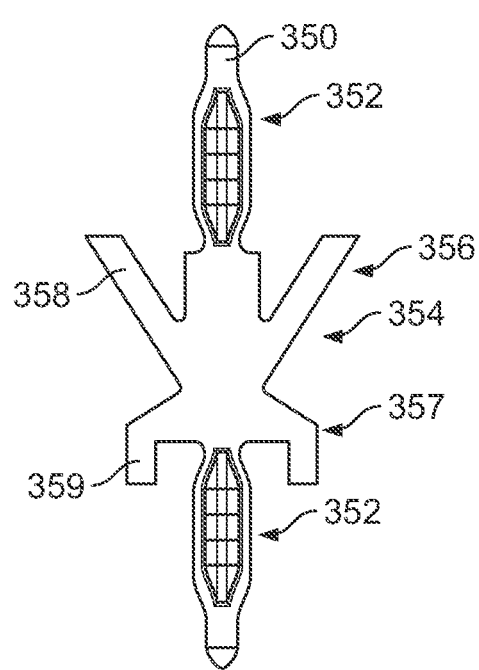
Fig. 6    Fig. 7

THERMAL PRESS-FIT TERMINAL

FIELD OF THE INVENTION

The present invention relates to connection devices, and more particularly, to improved devices for thermally connecting objects.

BACKGROUND

Modern electronics and electrical equipment generate significant amounts of heat which must be controlled (e.g., dissipated, conveyed, etc.) in order to ensure device performance and longevity requirements. In the case of a printed circuit board (PCB) having heat generating components arranged thereon, heat sinks are commonly attached to the PCB in one or more areas in order to aid in heat dissipation. Typically, heat sinks are connected to a PCB via the use of a plurality of screws, as are PCB-to-PCB connections, in order to ensure adequate compression or contact between adjacent components, and thus adequate heat transfer. However, the use of screws or other threaded fasteners increases costs and manufacturing complexity.

Accordingly, there is a need for improved systems and methods for achieving suitable mechanical attachment and thermal conductivity between a PCB and other components.

SUMMARY

In one embodiment of the present disclosure, a compliant pin or press-fit terminal for connecting a first component and a second component includes a first elastic portion for engaging with the first component, and a second elastic portion spaced apart from the first elastic portion along an axial length of the terminal for fixing the first component to the second component. The terminal may further include an intermediate portion arranged between the first and second elastic portions in an axial direction of the terminal. The intermediate portion comprises a first plurality of radially extending arms for engaging with the first component and a second plurality of radially extending arms for engaging with the second component for fixing a distance between the first component and the second component.

In another embodiment of the present disclosure, an electronics assembly comprises a heat sink, a printed circuit board, and a press-fit terminal extending through the printed circuit board for thermally connecting printed circuit board to the heat sink in an assembled state. The terminal includes a first elastic portion engaging with the printed circuit board and a second elastic portion spaced apart along an axial length of the terminal from the first elastic portion for fixing the printed circuit board to the heat sink.

BRIEF DESCRIPTION OF THE DRAWINGS

The invention will now be described by way of example with reference to the accompanying Figures, of which:

FIG. 4 is a partial cross-sectional view of an electronics assembly and press-fit terminal according to another embodiment of the present disclosure;

FIG. 5 is a front view of the press-fit terminal of FIG. 4;

FIG. 6 is a partial cross-sectional view of an electronics assembly and press-fit terminal according to another embodiment of the present disclosure;

FIG. 7 is a front view of the press-fit terminal of FIG. 6;

DETAILED DESCRIPTION OF THE EMBODIMENTS

Figure 1:
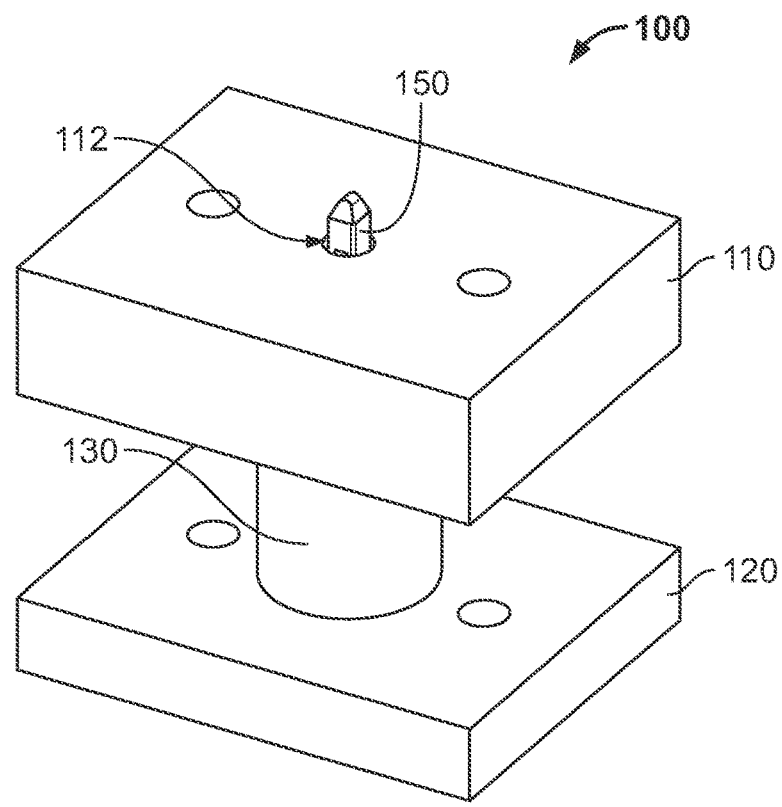
FIG. 1 is a partial perspective view of an electronics assembly including a press-fit terminal or compliant pin according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring generally to FIG. 1, an exemplary electronics assembly 100 useful for describing embodiments of the present disclosure includes a printed circuit board (PCB) 110 having a heat sink 120, such as an aluminum heat sink, mounted thereon. A standoff or spacer 130 is arranged between the PCB 110 and the heat sink 120 for elevating the PCB over a top surface of the heat sink. In an embodiment, the standoff 130 defines a generally hollow cylindrical body formed from a stainless steel or brass material. The standoff 130 may be formed integrally with the heat sink 120, or may be mechanically attached thereto by, for example, threading, adhesive, solder, or other mechanical methods which will be set forth herein.

Still referring to FIG. 1, the PCB 110 is attached to the standoff 130 and/or to the heat sink 120 via a press-fit terminal 150, which also may be referred to throughout as a terminal pin or compliant pin interchangeably. More specifically, in the exemplary embodiment, the PCB 110 include an aperture 112, which may take the form of a metalized via, formed therethrough for accepting an elastically-compressible end of the press-fit terminal 150. A second end of the press-fit terminal 150 (not shown) includes another elastically-compressible end for attaching to the standoff 130 and/or the heat sink 120 for maintaining heat conducting contact between the components. While only a single PCB-to-heatsink connection is shown, it should be understood that the PCB 110 may be supported on the heat sink 120 via a plurality of the illustrated connections.

Figure 2:
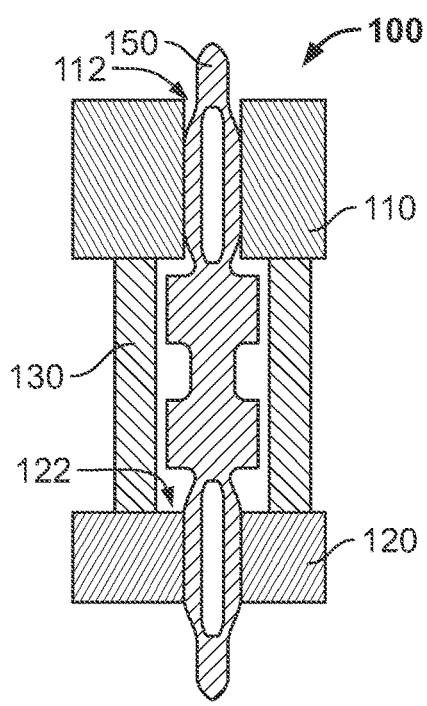
FIG. 2 is a partial cross-sectional view of the assembly of FIG. 1.
Figure 3:
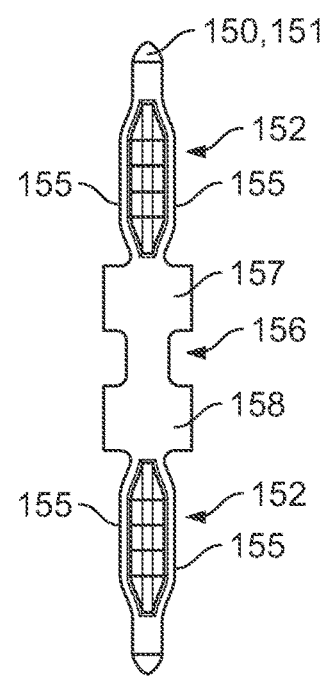
FIG. 3 is a front view of the press-fit terminal of FIGS. 1 and 2.

Referring now to FIGS. 2 and 3, the exemplary press-fit terminal 150 is embodied as a double-ended press-fit terminal, and may be formed by, for example, sheet metal stamping operations. Specifically, the press-fit terminal 150 defines two elastically-compliant or compressible areas or portions 152 formed proximate respective ends thereof. Each elastic portion 152 is defined by two generally opposing arcuate or radially expanding elastic arms 155 separated by a gap formed therebetween. In response to a lateral compressive force generated by its insertion into the aperture 112 of the PCB 110, or a corresponding aperture 122 of the heat sink, the arms 155 are elastically deformed generally radially inward, and apply an outward tension force against the opposing interior surface of the PCB or heat sink for holding the press-fit terminal 150 in position. Free ends 151 of the press-fit terminal 150 are generally tapered or contract radially such that each may be passed through the corresponding openings 112,122 formed through the PCB 110 and heat sink 120, respectively. During assembly, the PCB 110 and heat sink 120 are inserted over a respective free end of the press-fit terminal 150 and are urged together until contact is made with the standoff 130, engaging each of the PCB and heat sink with a respective one of the elastic portions 152. As shown, the distance between the PCB 110 and the heat sink 120 defined by the height of the standoff 130 is maintained by the friction force generated by the elastic portions 152 of the press-fit terminal 150.

The press-fit terminal 150 further comprises a central section or intermediate portion 156 extending radially and sized to be received within an interior of the standoff 130 in the assembled state. The intermediate portion 156 may include upper and lower radially extending portions 157,158 each having surfaces opposing a respective one of the heat sink 120 and the PCB 110. The expanded intermediate portion 156 acts to maintain the press-fit terminal 150 in a predetermined position in the axial direction, or range of predetermined positions, between the heat sink 120 and the PCB 110, ensuring the elastic portions 152 are sufficiently engaged.

In the exemplary embodiment, the standoff 130 may be mechanically fixed to either or both of the PCB 110 and the heat sink 120 by, for example, soldering or an adhesive. However, due to the press-fit terminal 150 frictionally engaging with both the PCB 110 and the heat sink 120, such a positive mechanical connection is not required, and the standoff 130 may be held between and in contact with the PCB 110 and the heat sink 120 only by the friction forces generated by the press-fit terminal 150.

Referring now to FIGS. 4 and 5, an electronics assembly 200 according to another embodiment of the present disclosure is adapted to eliminate the need for a standoff between the PCB 110 and the heat sink 120. More specifically, a double-ended press-fit terminal 250 is provided having elastic portions 252 at each end thereof similar to the embodiment of FIGS. 2 and 3. Arranged between the elastic portions 252 is an intermediate portion 254 including two flange-like arm sections 256. Each arm section 256 comprises at least one arm 258 which defines a contact surface 259 opposing one of the PCB 110 and the heat sink 120 in axial or insertion directions of the terminal 250. In the exemplary embodiment, each arm section 256 comprises a pair of cantilevered arms 258, each which define a generally L-shaped profile, extending both radially and axially from the intermediate portion 254. In this way, as the assembly 200 is pressed together, the PCB 110 and the heat sink 120 abut respective pairs of the arms 258 of each arm section 256, mechanically limiting the axial distance between the PCB and the heat sink, and eliminating the need for the standoff 130. In the illustrated embodiment, a length in the axial direction of the pairs of extending arms 258 engaging the PCB 110 is shorter than the other pair of arms 258. Compressive force acting on the arms 258 by the mating of the PCB 110 and heat sink 120, and the holding force of the elastic portions 252, may provide a degree of elastic deflection of the arms.

An assembly 300 according to another embodiment of the present disclosure is shown in FIGS. 6 and 7. The assembly 300 includes features similar to those set forth above with respect to FIGS. 4 and 5, including a double-ended press-fit terminal 350 having elastic portions 352 at each end thereof similar to the preceding embodiments. In distinction, arranged between the elastic portions 352 is an intermediate portion 354 including first and second flange-like arm sections 356,357. The first arm section 356 includes two generally linear arms 358 extending obliquely radially-outward from a central area of the intermediate portion 354 and toward the PCB 110, with free ends thereof engaging with the PCB. Compressive force acting on the arms 358 by the mating of the PCB 110 and heat sink 120, and the holding force of the elastic portions 352, provides a degree of elastic deflection of the arms. The second arm section 357 comprises features similar to those described above with respect to FIGS. 4 and 5, including a pair of L-shaped arms 359 which extend radially outward, and in turn extend generally axially or normal to the heat sink 120 so as to abut or oppose the heat sink in the axial direction, Like the embodiment of FIGS. 4 and 5, as the assembly 300 is pressed together, the PCB 110 and the heat sink 120 abut respective pairs of extending arms of each arm section 356,357, limiting or mechanically fixing the axial distance between the PCB and the heat sink, and eliminating the need for the standoff 130.

Figure 8:
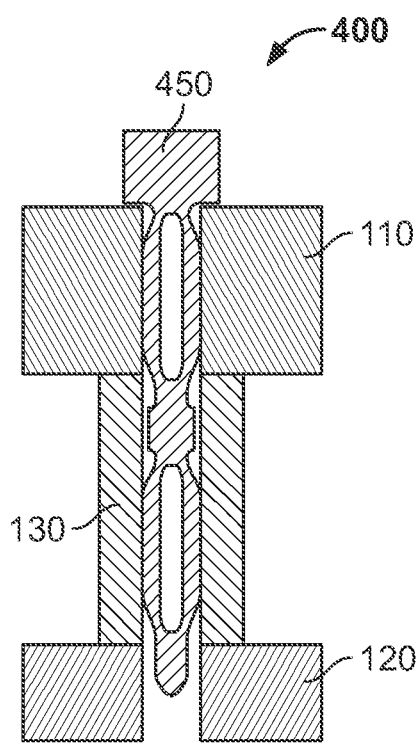
FIG. 8 is a partial cross-sectional view of an electronics assembly and press-fit terminal according to another embodiment of the present disclosure.
Figure 9:
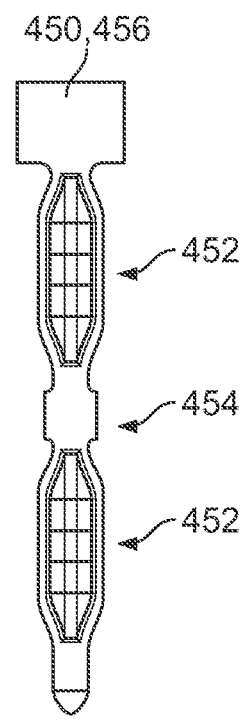
FIG. 9 is a front view of the press-fit terminal of FIG. 8.

Referring now to FIGS. 8 and 9, an assembly 400 utilizes a top-loading press-fit terminal 450 for connecting the PCB 110 to the heat sink 120 with a standoff 130 arranged therebetween. The press-fit terminal 450 includes two elastic portions 452 separated in an axial direction of the terminal, with a first one of the elastic portions 452 adapted to be aligned and engage with the PCB 110, and a second one of the elastic portions 452 positioned to align and engage with the standoff 130. Arranged between the elastic portions 452 may be a radially-expanding intermediate portion 454 similar to that described above with respect to FIGS. 2 and 3. In this embodiment, the standoff 130 may mechanically fixed to the heat sink 120 via, for example, soldering or an adhesive, or may be formed integrally therewith. In other embodiments, the second elastic area 452 may be positioned further axially downward for elastically engaging directly with the heat sink 120, as shown in the preceding embodiments. In this way, the standoff 130 may not be independently fixed to the heat sink 120. The press-fit terminal 450 is a top-loading pin, whereby it is inserted into the assembly 400 in a downward direction through each of the PCB 110, the standoff 130 and/or the heat sink 120. A radially-extending head or tab 456 of the press-fit terminal 450 extends generally parallel with a planar upper surface of the PCB 110, and makes abutting contact therewith in order to generate compressive force between the components, thus ensuring adequate heat conductivity.

Figure 10:
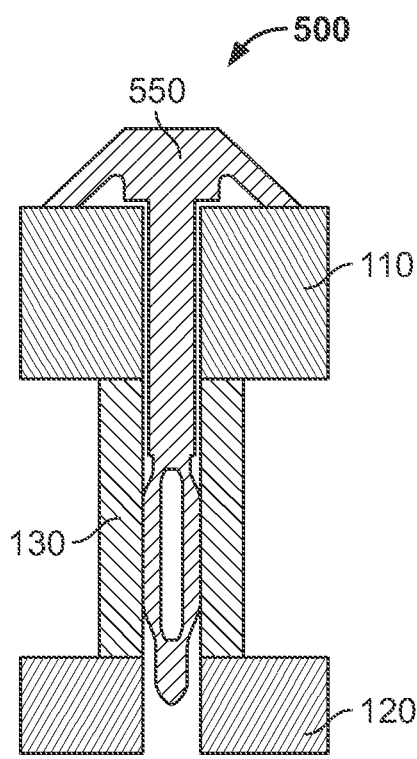
FIG. 10 is a partial cross-sectional view of an electronics assembly and press-fit terminal according to another embodiment of the present disclosure.
Figure 11:
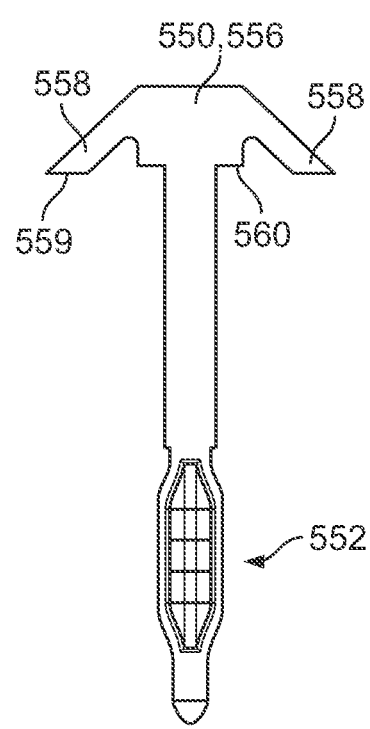
FIG. 11 is a front view of the press-fit terminal of FIG. 10.

FIGS. 10 and 11 illustrate another top-loading press-fit terminal 550 used in an assembly 500 according to an embodiment of the present disclosure. As with the illustrated embodiment of FIGS. 8 and 9, the press-fit terminal 550 connects the PCB 110 and the heat sink 120 via the standoff 130. Specifically, the press-fit terminal 550 comprises a first elastic area or portion 552 engaging with the standoff 130, however, a second and/or third elastic portion may also be provided in the area of the PCB 110 and/or an elastic portion engaging the heat sink 120 directly, similar to the preceding embodiments. The press-fit terminal 550 includes a head elastically engaging with the PCB 110. More specifically, a second elastically-compliant or elastic portion is embodied as an elastic head 556 of the press-fit terminal 550. The elastic portion or head 556 includes two cantilevered elastic arms 558. The arms 558 extend obliquely radially outward with respect to a central axis of the press-fit terminal 550 and define free ends extending in a direction generally toward the PCB 110 in an installed orientation. Free ends 559 of the arms 558 extend further downward toward the PCB 110 in the axial direction than an opposing surface 560 of a remainder of the head 556. In this way, during assembly, the arms 558 will contact the PCB 110 prior to a remainder of the head 556. Due to the inherent elasticity and orientation of the arms 558, insertion of the press-fit terminal 550 into the assembly 500 with sufficient axial force expands the arms further radially outward. With the elastic portion 552 retaining the press-fit terminal 550 in the axial position, the elastic return force applied on the PCB 110 by the elastic arms 558 maintains a compressive force on the assembly 500, ensuring adequate heat conductive contact between the components.

Figure 12:
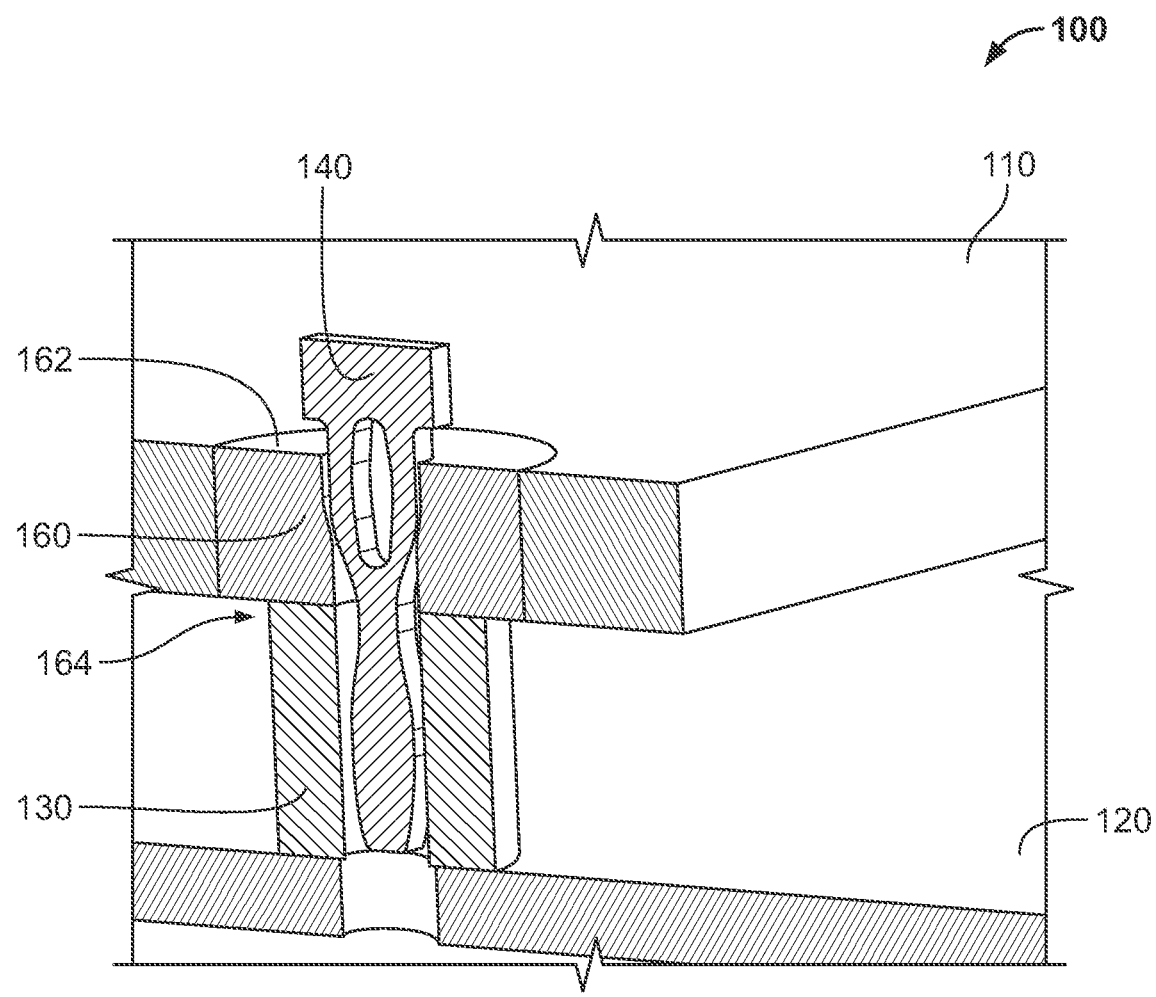
FIG. 12 is partial perspective view of an electronics assembly according to another embodiment of the present disclosure.

As shown in FIG. 12, in an exemplary embodiment, the PCB 110 may define a metalized, heat conducting via 160 formed therethrough for receiving the press-fit terminal 140, improving the heat conducting performance of the assembly. The exemplary via 160 includes an exposed metalized top pad 162, a metalized bottom pad 164 contacting the standoff 130, and a generally hollow metalized cylindrical central portion extending therebetween. It should be understood that these via, pads and other heat conducting structures may be present in any of the above-described embodiments without departing from the scope of the present disclosure.

Additionally, while the above embodiments of press-fit terminals have been described in the context of PCB-to-heat sink connections, it should be understood that the press-fit terminals disclosed herein may be used to secure any two objects together, including PCB-to-PCB connections.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electronics assembly, comprising:
   a heat sink;
   a printed circuit board;
   a press-fit terminal extending through the printed circuit board for thermally connecting the printed circuit board to the heat sink in an assembled state, the terminal including a first elastic portion engaging with the printed circuit board, and a second elastic portion spaced apart along an axial length of the terminal from the first elastic portion and including two opposing elastic arms compressible in a radial direction for fixing the printed circuit board to the heat sink; and
   a spacer arranged between the heat sink and the printed circuit board and including an aperture formed therethrough for receiving at least a portion of the terminal, the spacer directly contacting the printed circuit board and the heat sink uniformly about a circumference of the aperture,
   wherein the first elastic portion includes two opposing elastic arms compressible in a radial direction for fixing the terminal to the printed circuit board, the terminal further including an intermediate portion arranged between the first and second elastic portions and defining a first surface opposing the printed circuit board in an insertion direction of the first elastic portion and a second surface opposing the heat sink in an insertion direction of the second elastic portion for fixing a distance between the printed circuit board and the heat sink in the assembled state, and
   wherein the intermediate portion includes a first plurality of radially extending portions defining the first surface and engaging with the printed circuit board and a second plurality of radially extending portions defining the second surface and engaging with the heat sink.

2. The electronics assembly of claim 1, wherein one of the first plurality of radially extending portions or the second plurality of radially extending portions comprises a pair of linear arms extending obliquely from the intermediate portion.

3. The electronics assembly of claim 1, wherein the second elastic portion engages with the spacer.

4. The electronics assembly of claim 3, wherein the terminal includes a tab formed on a first end thereof, the terminal insertable through the printed circuit board with the tab abutting a side of the printed circuit board opposite the spacer in the mated state.

5. The electronics assembly of claim 1, wherein the second elastic portion engages with the heat sink.

6. The electronics assembly of claim 1, wherein the first elastic portion exerts a spring force in a direction opposite the insertion direction of the terminal in the assembled state.

7. The electronics assembly of claim 6, wherein the first elastic portion is defined on a first end of the terminal and includes at least one cantilevered elastic arm extending obliquely from the terminal and toward the printed circuit board.

8. The electronics assembly of claim 7, wherein the second elastic portion is defined proximate a second end of the terminal and is inserted through the printed circuit board and elastically engages one of the spacer or the heat sink.

9. The electronics assembly of claim 1, wherein the spacer defines a hollow cylinder and directly contacts the printed circuit board and the heat sink continuously about the circumference of the aperture.

10. A press-fit terminal for connecting a first component and a second component, comprising:

a first plurality of linear, radially extending cantilevered arms extending obliquely from an intermediate portion of the terminal and adapted to engage with a bottom side of the first component;
a second plurality of L-shaped cantilevered arms extending both radially and axially from the intermediate portion of the terminal and adapted to engage with a side of the second component opposing the bottom side of the first component and fixing a distance between the first component and the second component in an assembled state;
a first elastic portion spaced above the first plurality of radially extending cantilevered arms along an axial length of the terminal and including two opposing elastic arms compressible in a radial direction for fixing the terminal relative to the second component; and
a second elastic portion spaced below the second plurality of radially extending cantilevered arms along the axial direction of the terminal and including two opposing elastic arms compressible in a radial direction for fixing the terminal relative to the second component.

11. An electronics assembly, comprising:
a first component;
a second component spaced apart from the first component;
a press-fit terminal inserted through at least the first component in an insertion direction and having a first elastic portion engaging with the first component, a second elastic portion including two opposing elastic arms compressible in a radial direction for securing the terminal to the second component, the terminal thermally connecting the first component and the second component in an assembled state; and
a spacer arranged between the first component and the second component and including an aperture formed therethrough for accepting at least a portion of the terminal, the spacer is fixed to the second component independent of the terminal and the second elastic portion of the terminal engages with the aperture of the spacer.

12. The electronics assembly of claim 11, wherein the terminal does not contact the second component.

13. The electronics assembly of claim 11, wherein the first component is a printed circuit board and the second component is a metallic heat sink.

14. The electronics assembly of claim 11, wherein the spacer is fixed to the second component via at least one of an adhesive or soldering.

15. The electronics assembly of claim 11, wherein the first component includes a metalized via extending therethrough, the press-fit terminal inserted through the metalized via in the insertion direction and the first elastic portion engaged with an internal surface of the metalized via.

16. The electronics assembly of claim 15, wherein the metalized via includes:
an exposed metalized top pad;
a metalized bottom pad contacting the spacer; and
a metalized cylinder extending between the top pad and the bottom pad and including a central opening defining the aperture and receiving the terminal.

* * * * *